United States Patent
Kim et al.

(10) Patent No.: US 7,420,207 B2
(45) Date of Patent: Sep. 2, 2008

(54) PHOTO-DETECTING DEVICE AND RELATED METHOD OF FORMATION

(75) Inventors: Tae-Jin Kim, Suwon-si (KR); Kwang-Joon Yoon, Seoul (KR); Phil-Jae Chang, Seoul (KR); Kye-Won Maeng, Seoul (KR); Young-Jun Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 436 days.

(21) Appl. No.: 11/305,033

(22) Filed: Dec. 19, 2005

(65) Prior Publication Data
US 2006/0138580 A1 Jun. 29, 2006

(30) Foreign Application Priority Data
Dec. 20, 2004 (KR) .............. 10-2004-0108791

(51) Int. Cl.
*H01L 31/0368* (2006.01)
(52) U.S. Cl. .......... 257/55; 257/53; 257/184; 257/E31.046; 438/57; 438/94
(58) Field of Classification Search .......... 257/55, 257/53, 184, E31.046; 438/57, 94
See application file for complete search history.

(56) References Cited

U.S. PATENT DOCUMENTS

| | | | |
|---|---|---|---|
| 4,651,187 A * | 3/1987 | Sugimoto et al. ........... 257/186 |
| 4,745,449 A * | 5/1988 | Chang et al. ............. 257/289 |
| 5,218,213 A * | 6/1993 | Gaul et al. ............... 257/55 |
| 5,557,121 A * | 9/1996 | Kozuka et al. ............ 257/292 |
| 5,576,221 A * | 11/1996 | Takemura et al. ........... 438/57 |
| 6,534,335 B1 * | 3/2003 | Rhodes et al. ............. 438/60 |
| 6,924,167 B1 * | 8/2005 | Hopper et al. ............. 438/57 |
| 7,250,325 B2 * | 7/2007 | Janesick et al. ............ 438/73 |
| 2002/0014643 A1 * | 2/2002 | Kubo et al. .............. 257/290 |
| 2003/0183819 A1 * | 10/2003 | Aoki et al. ............... 257/55 |
| 2005/0136566 A1 * | 6/2005 | Morse ..................... 438/63 |
| 2006/0163612 A1 * | 7/2006 | Kouvetakis et al. ......... 257/201 |

FOREIGN PATENT DOCUMENTS

| | | |
|---|---|---|
| JP | 10-270746 | 10/1998 |
| JP | 2001-345436 | 12/2001 |
| JP | 2001-352093 | 12/2001 |
| JP | 2002-118280 | 4/2002 |
| KR | 1998-025177 | 7/1998 |

* cited by examiner

*Primary Examiner*—Evan Pert
*Assistant Examiner*—Victor A Mandala, Jr.
(74) *Attorney, Agent, or Firm*—Volentine & Whitt, PLLC (57) ABSTRACT

A photo-detecting device includes a buried doping layer of a first conductivity type and disposed at an upper portion of a silicon substrate. A first silicon epitaxial layer of first conductivity type is disposed on the buried doping layer, and a second silicon epitaxial layer of second conductivity type is disposed on the first silicon epitaxial layer. An isolation doping layer doped of first conductivity type is disposed at a predetermined region of the second silicon epitaxial layer to define a body region of second conductivity type. A silicon germanium epitaxial layer of second conductivity type is disposed on the body region.

24 Claims, 11 Drawing Sheets

Fig. 1

(Conventional Art)

Fig. 2

(Conventional Art)

Fig. 3

(Conventional Art)

Fig. 4

(Conventional Art)

PHOTO-DETECTING DEVICE AND RELATED METHOD OF FORMATION

BACKGROUND OF THE INVENTION

1. Field of the Invention

Embodiments of the invention relate generally to semiconductor devices and related methods of fabrication. More particularly, embodiments of the invention relation to semiconductor devices comprising a photo-detecting device adapted to convert optical signals into electrical signals and related methods of formation.

This application claims priority to Korean Patent Application 2004-108791 filed on Dec. 20, 2004, the subject matter of which is hereby incorporated by reference.

2. Description of Related Art

Photo-detecting devices are common constituents of contemporary semiconductor devices adapted to detect externally provided optical signals and converting these to corresponding electrical signals. For example, photo-detecting devices have been used as a driver (or optical pick-up component) adapted to read data recorded on optical storage media, such as compact disc (CD) or digital versatile disc (DVD). Recent product design trends are demanding better access speeds from drivers, and in general photo-detecting devices face increasing pressure to operate at ever faster operating speeds.

Conventional photo-detecting devices typically include a photodiode serving as a light receiving portion of the device. A typical conventional photodiode will now be described below with reference to FIGS. 1 through 4.

Figure 1:
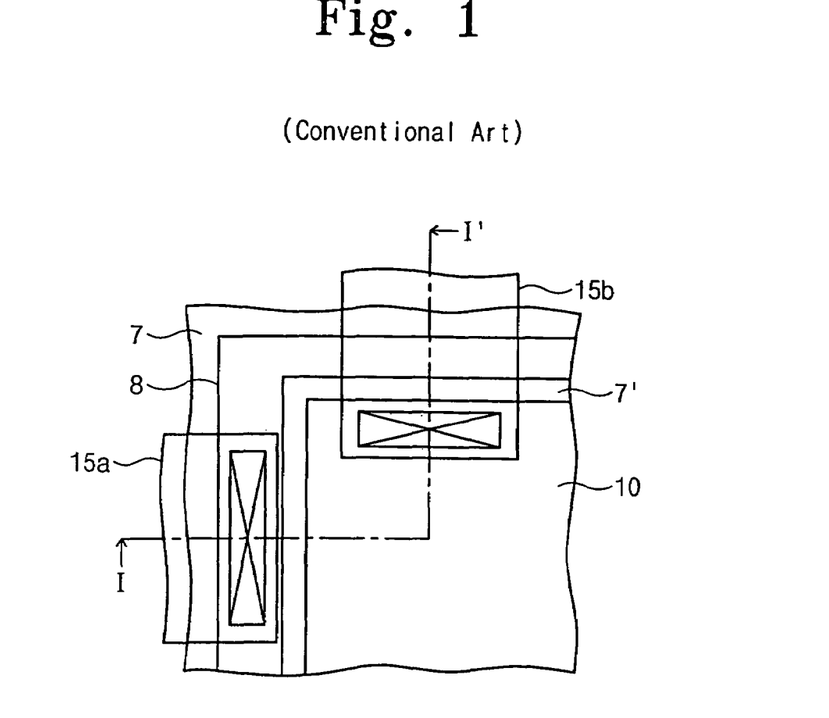
FIG. 1 is a plan view of a photodiode in a conventional photo detecting device.
Figure 2:
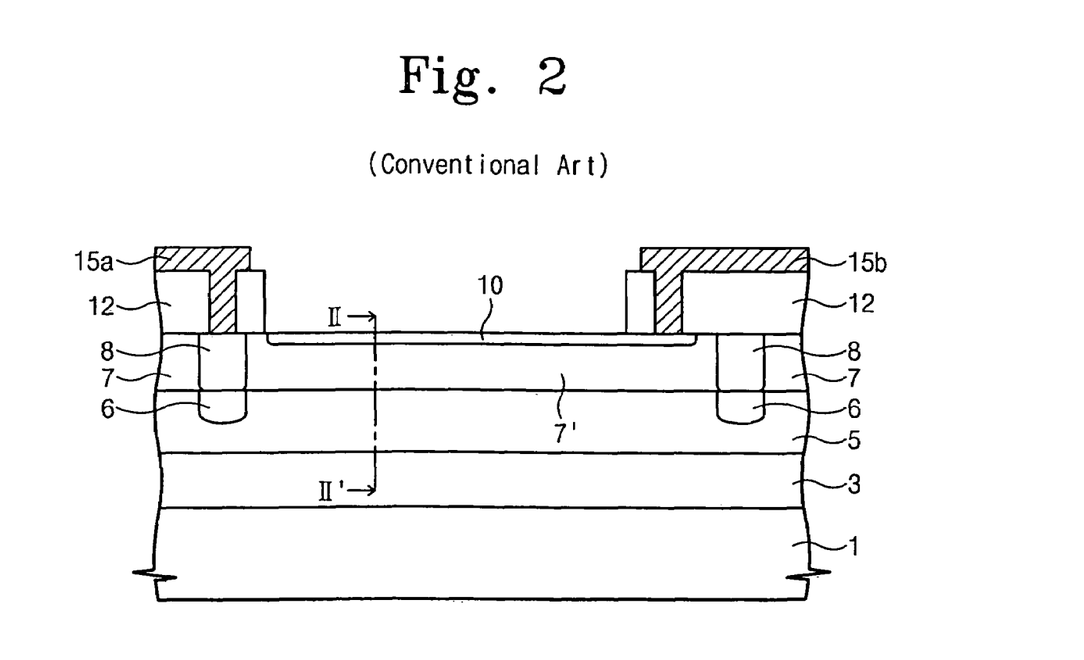
FIG. 2 is a cross-sectional view taken along a line I-I' of FIG. 1.

FIG. 1 is a plan view of a photodiode included within a conventional photo-detecting device. FIG. 2 is a cross-sectional view taken along a line I-I' of FIG. 1.

Referring to FIGS. 1 and 2, a buried p-type (e.g. doped with p-type impurities) doping layer 3 is disposed on a silicon substrate 1. (Throughout hit description the term "on" in this context means either one layer, device, and/or region "directly on" another layer, device and/or region, or one layer, device, and/or region on another with intervening layers, regions and/or devices present). A p-type silicon epitaxial layer 5 and an n-type silicon epitaxial layer 7 are then sequentially stacked on buried doping layer 3.

An isolation doping layer 8 defines an n-type silicon body region 7' within n-type epitaxial layer 7. P-type isolation doping layer 8 extends downward through n-type epitaxial layer 7 to electrically connect p-type epitaxial layer 5. N-type body region 7' is thus isolated by isolation doping layer 8 and n-type epitaxial layer 5.

A p-type buffer doping layer 6 is disposed at the portion of p-type silicon epitaxial layer 5 contacting isolation doping layer 8. The doping concentration for buffer doping layer 6 is higher than that of p-type epitaxial layer 5.

A heavily doped n-type layer 10, having a doping concentration higher than that of n-type body region 7', is formed on an upper portion of n-type body region 7'. Heavily doped n-type layer 10 and n-type body region 7' correspond to an "n-region" of the photodiode being formed, and p-type epitaxial layer 5 and buried doping layer 3 disposed below the n-region correspond to a "p-region" of the photodiode.

An interlayer oxide layer 12 is formed on the resulting structure. An opening is formed in interlayer oxide layer 12 to expose heavily doped n-type layer 12. However, interlayer oxide layer 12 covers an edge portion of heavily doped n-type layer 10. First and second interconnections 15a and 15b are formed through interlayer oxide layer 12. First interconnection 15a is electrically connected to isolation doping layer 8 through interlayer oxide layer 12. Accordingly, first interconnection 15a is electrically connected with the p-region of the photodiode through isolation doping layer 8 and buffer doping layer 6. Second interconnection 15b is connected to the edge portion of heavily doped n-type layer 10 through interlayer oxide layer 12.

Figure 3:
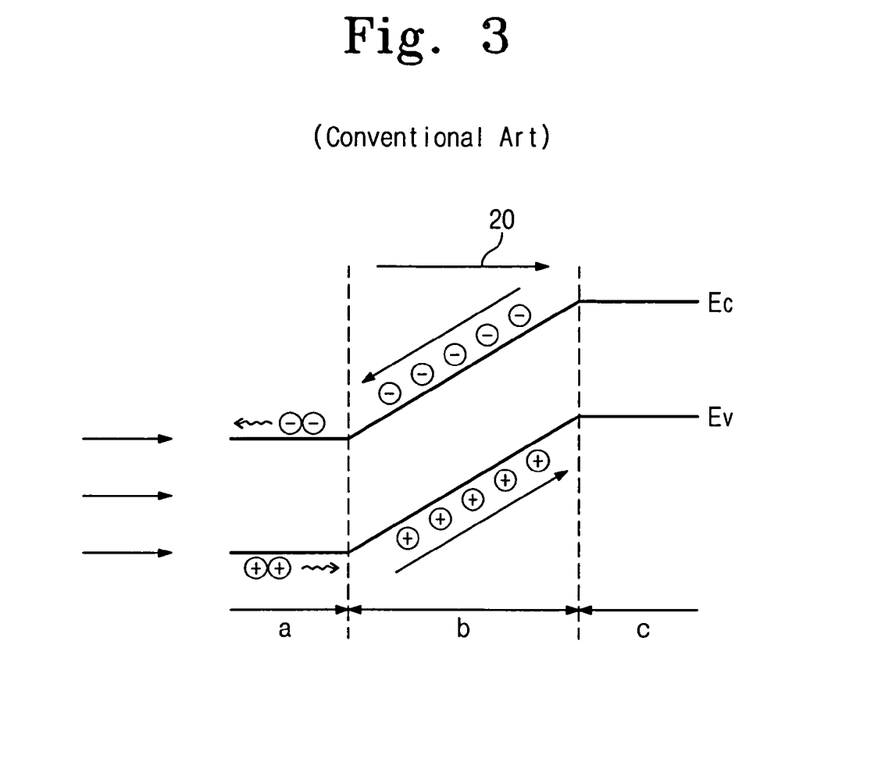
FIG. 3 is an energy band diagram taken along a line II-II' of FIG. 2.

An operating method of this exemplary, conventional photodiode structure now will be described in the context of the energy band diagram illustrated in FIG. 3. In FIG. 3, reference numerals "a", "b" and "c" denote respectively the n-type neutral region, a depletion region, and a p-type neutral region, of the photodiode.

Referring to FIGS. 1-3, a reverse bias may be applied to the photodiode at a standby state. The depletion region "b" may include a majority of n-type body region 7', as well as a majority of p-type epitaxial layer 5 below n-type body region 7'.

The photodiode is divided into the n-type neutral region "a", the depletion region "b", and the p-type neutral region "c" by a PN junction. The n-type and the p-type neutral regions "a" and "c" are placed in a neutral state under conditions wherein electric fields are not established. An internal electric field 20 is established in depletion region "b".

In the standby state, an external optical signal is applied to the photodiode through heavily n-type doped layer 10. The applied optical signal generates electron-hole pairs (EHPs) in the photodiode. The generated electrons migrate along a conductivity band Ec and the generated holes migrate along a valence band Ev, allowing signal current to flow between first and second interconnections 15a and 15b.

In the conventional photodiode, the electrons and holes generated in depletion region "b" in response to the applied optical signal are accelerated by internal electric fields 20 in depletion region "b". In contrast, electrons and holes generated in depletion regions "a" and "c" migrate by means of diffusion. This migration path for the electrons and holes increases their migration time, so that the response characteristics of the photodiode (i.e., a reactive speed with respect to the optical signal) are degraded.

More particularly, the optical signal is applied with greatest intensity to the surface of n-type neutral region "a" (i.e., a surface of heavily n-type layer 10). The greater the depth of this intensity from the surface of n-type neutral region "a", the stronger the intensity of the optical signal. Therefore, diffusion migration of the electrons and holes generated in n-type neutral region "a" is a major factor in the degradation of response characteristics for the photodiode.

Figure 4:
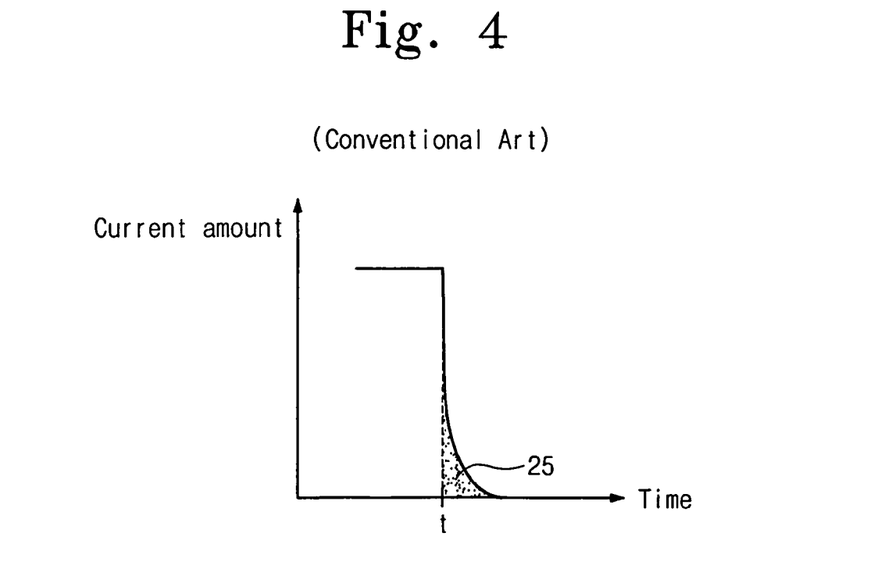
FIG. 4 is a graph for illustrating response characteristics of a photo detecting device with respect to an optical signal.

Exemplary response characteristics for the conventional photodiode now will be described with reference to FIG. 4. In FIG. 4, the x-axis represents time required for applying an optical signal, and the y-axis represents the amount of signal current generated by the optical signal. Additionally, a reference numeral "t" indicates an instance in time at which the optical signal is no longer applied to the photodiode.

Referring to FIGS. 1-4, when an optical signal having a determined intensity is applied to the photodiode, electron-hole pairs are generated mainly in n-type neutral regions "a" and depletion regions "b". The generated electrons and holes migrate due to diffusion and internal electric fields 20, allowing signal current to flow between interconnections 15a and 15b. For a given optical signal intensity, signal current will flow at a corresponding rate.

From time "t" forward when the optical signal is no longer applied to the photodiode, the amount of the signal current flowing from the photodiode decreases rapidly. Ideally, this signal current would stop immediately at time "t". However, some diminishing amount of signal current, or tail current 25, continues to flow after time "t" due to the migration time lag of electrons and holes generated in the photodiode.

At time "t", the holes generated in depletion region "b" migrate more quickly under the influence of internal field 20 while the holes generated in n-type neutral region "a" migrate to depletion region "b" via diffusion effects. Therefore, the migration time for holes generated in n-type neutral region tends to increase the length of tail current 25.

Unfortunately, as the tail current 25 increases in length, the response characteristics of the photodiode are degraded, thereby decreasing the overall operating speed of the photodiode. Moreover, tail current 25 may actually result in increased noise distorting the output signal characteristics of the photodiode.

SUMMARY OF THE INVENTION

In one embodiment, the invention provides a photo-detecting device comprising; a buried doping layer of first conductivity type disposed on a silicon substrate, a first silicon epitaxial layer of first conductivity type disposed on the buried doping layer, a second silicon epitaxial layer of second conductivity type disposed on the first silicon epitaxial layer, an isolation doping layer of first conductivity type disposed at predetermined regions of the second silicon epitaxial layer to define a body region formed from a portion of the second silicon epitaxial layer, and a silicon germanium epitaxial layer of second conductivity type disposed on the body region.

In another embodiment, the invention provides a method for forming a photo-detecting device, comprising; forming a buried doping layer doped of first conductivity type on a silicon substrate, forming a first silicon epitaxial layer of first conductivity type on the buried doping layer, forming a second silicon epitaxial layer of second conductivity type on the first silicon epitaxial layer, forming an isolation doping layer of first conductivity type at a predetermined region of the second silicon epitaxial layer to define a body region from a portion of the second silicon epitaxial layer, and forming a silicon germanium epitaxial layer of the second conductivity type on the body region.

BRIEF DESCRIPTION OF THE DRAWINGS

Several embodiments of the invention are described hereafter with reference to the accompanying drawings. In the drawings, the illustrated thickness of layers and/or regions may be exaggerated for clarity. Like numbers in the drawings refer to like elements throughout. In the drawings:

FIGS. 10A-14A are cross-sectional views, taken along a line III-III' of FIG. 5, for illustrating a method for forming a photo detecting device according to the present invention.

FIGS. 10B-14B are cross-sectional views, taken along a line IV-IV' of FIG. 5, for illustrating a method for forming a photo detecting device according to the present invention.

DESCRIPTION OF EXEMPLARY EMBODIMENTS

Several embodiments of the invention will now be described as teaching examples. The invention may, however, be embodied in different forms and should not be constructed as limited to only the embodiments set forth herein.

Figure 5:
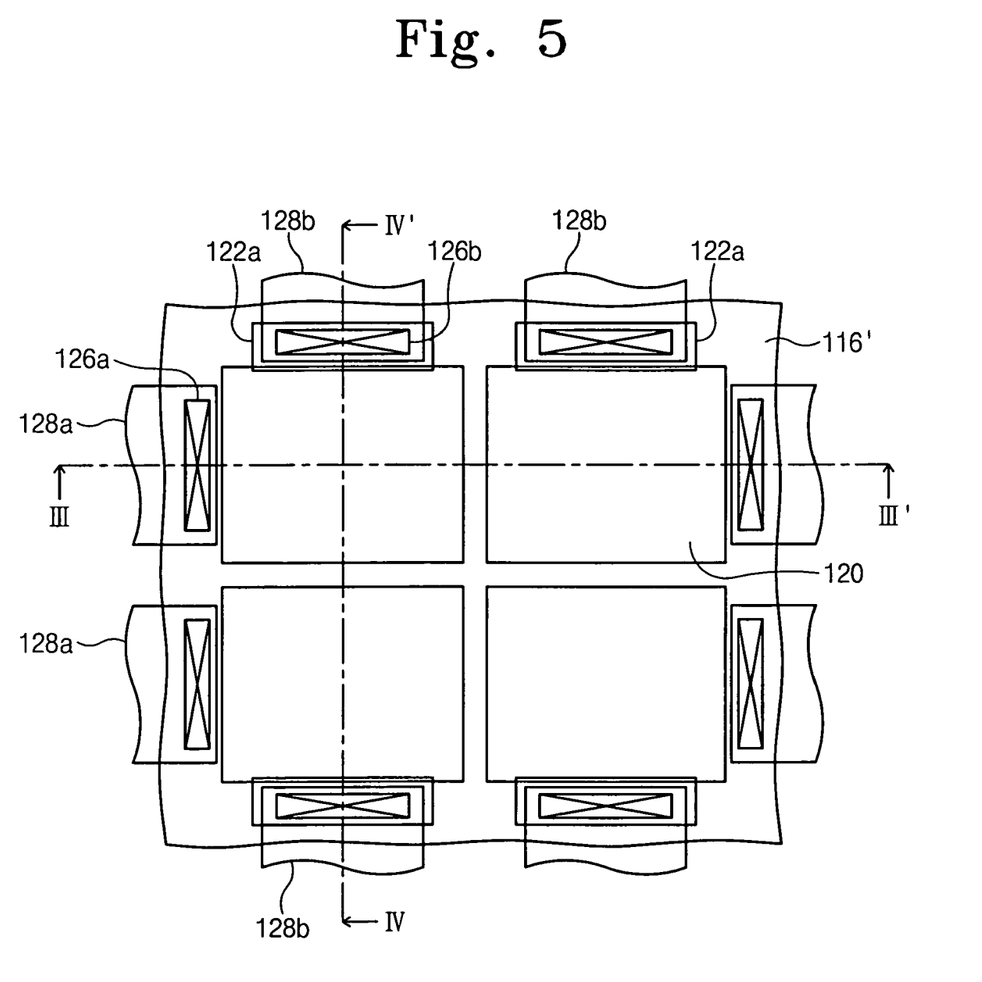
FIG. 5 is a top plan view of a photo detecting device according to the present invention.
Figure 6A:
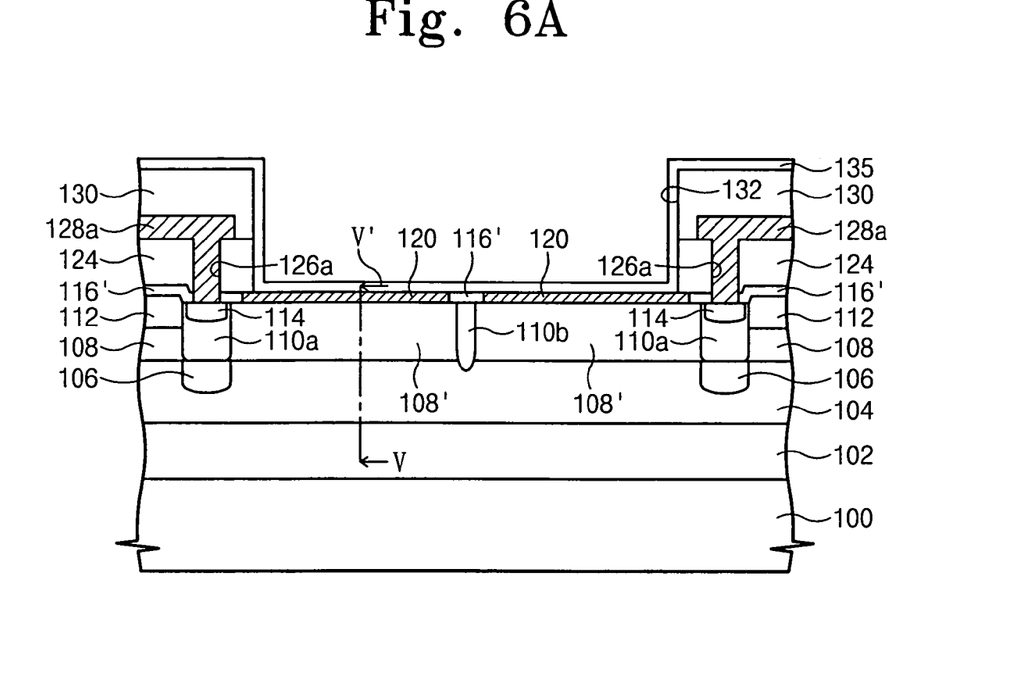
FIGS. 6A-6B are cross-sectional views takes along lines III-III' and IV-IV' of FIG. 5, respectively.
Figure 6B:
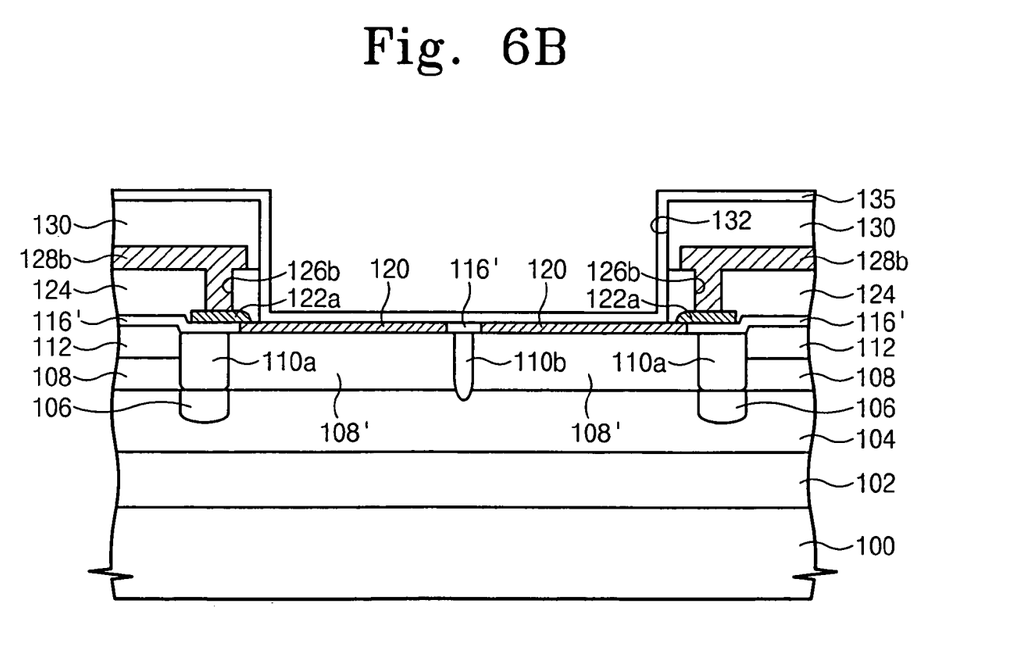

FIG. 5 is a top plan view of a photo detecting device according to one embodiment of the invention. FIGS. 6A-6B are cross-sectional views taken along lines III-III' and IV-IV' of FIG. 5, respectively.

Referring to FIGS. 5 and 6A-6B, a buried doping layer 102 is disposed at an upper portion of a silicon substrate 100. The buried doping layer 102 is made of single-crystalline silicon and doped with impurities of first conductivity type. The buried doping layer 102 may be a portion of the silicon substrate 100.

A first silicon epitaxial layer 104, which are doped with impurities of the first conductivity type, is disposed on the buried doping layer 102. The first silicon epitaxial layer 104 is made of single-crystalline silicon. Since the first silicon epitaxial layer 104 and the buried doping layer 102 are doped with impurities of the same conductivity type, they are electrically connected with each other. A doping concentration of the buried doping layer 102 is higher than that of the first silicon epitaxial layer 104.

A second silicon epitaxial layer 108, which is doped with impurities of a second conductivity type, is disposed on the first silicon epitaxial layer 104. The second silicon epitaxial layer 108 is made of single-crystalline silicon. The first and the second silicon epitaxial layers 104 and 108 are doped with impurities of different conductivity types.

In other words, the impurities of first conductivity type and the impurities of second conductivity type are impurities of different conductivity types. The impurities of first conductivity type and the impurities of second conductivity type may be, for example, P-type impurities and N-type impurities, respectively. To the contrary, the impurities of first conductivity type and the impurities of second conductivity type may be, for example, N-type impurities and P-type impurities, respectively.

A device isolation layer 112 disposed to define an active region at a predetermined region of the second silicon epitaxial layer 104. The device isolation layer 112 may be formed from an insulating material such as silicon oxide. At least one photodiode is disposed in the active region. As illustrated in one embodiment, four photodiodes are disposed in a matrix of two rows and two columns in the active region. However, it will be understood that any reasonable number and/or arrangement of photodiodes may be disposed in the active region.

Isolation doping layers 110A and 110B are disposed at predetermined positions with the active region to define a body region 108' of second conductivity type. The body region 108' is formed within the second silicon epitaxial layer 108, and each body region 108' serves as one element constituting one photodiode. The isolation doping layers 110a and 110b are doped with impurities of first conductivity type to isolate the body region 108' of second conductivity type. The four body regions 108' may be defined within the active region by the isolation doping layers 110a and 110b.

The isolation doping layers 110a and 110b extend downward to electrically connect the first silicon epitaxial layer 104. The isolation doping layers 110a and 110b are doped with impurities of the same conductivity type as the first silicon epitaxial layer 104. The isolation doping layers 110a and 110b are connected with the first silicon epitaxial layer 104, so that the body region 108' is encompassed by the isolation doping layer 110a and 110b and the first silicon epitaxial layer 104.

The isolation doping layers 110a and 110b may be divided into a peripheral isolation doping layer 110a and a central isolation doping layer 110b. The peripheral isolation doping layer 110a is disposed along the edge of the active region to encompass the plural body regions 108', and the central isolation doping layer 110b is disposed between the respective body regions 108'.

A silicon germanium epitaxial layer 120 doped with impurities of second conductivity type is disposed on the body region 108'. The silicon germanium epitaxial layer 120 may be made of single-crystalline silicon germanium. Four silicon germanium epitaxial layers 120 are disposed in a matrix of two rows and columns on the active regions to each correspond to the four body regions 108'. The silicon germanium epitaxial layers 120 are spaced to be electrically insulated from each other.

The buried doping layer 102 and the first silicon epitaxial layer 104 below the body region 108' constitute a "first semiconductor portion" of first conductivity type. Further, the body region 108' and the silicon germanium epitaxial layer 120 constitute a "second semiconductor portion" of second conductivity type. The first and second semiconductor portions form a PN junction, constituting a photodiode. A boundary surface of the PN junction (hereinafter referred to as "a PN facing surface") corresponds to a boundary surface between the first silicon epitaxial layer 104 and the body region 108'. From the PN junction facing surface, a depletion layer is formed extending toward the first and second semiconductor portions. A first conductivity-type region is formed at the first semiconductor portion below the depletion region, and a second conductivity-type region is formed at the second semiconductor portion on the depletion region. The first and the second conductivity-type regions correspond to conventional neutral regions.

The depletion region may be formed at an entire first silicon epitaxial layer 104 as well as an entire body region 108' below the body region 108'. In addition, the depletion region may extend to an upper portion of the buried doping layer 102 below the body region 108' and a lower portion of the silicon germanium epitaxial layer 102.

An insulation layer 116' covers the first silicon epitaxial layer 108 around the silicon germanium epitaxial layer 120. Specifically, the insulation layer 116' covers the isolation doping layer 110a and 110b. In addition, the insulation layer 116' may cover the device isolation layer 112 disposed on the first silicon epitaxial layer 108 as well as the edge of a top surface of the body region 108'. The insulation layer 116' may be formed from an insulating material such as silicon oxide.

The silicon germanium epitaxial layer 120 will be described below in some additional detail with reference to FIGS. 7 and 8.

Figure 7:
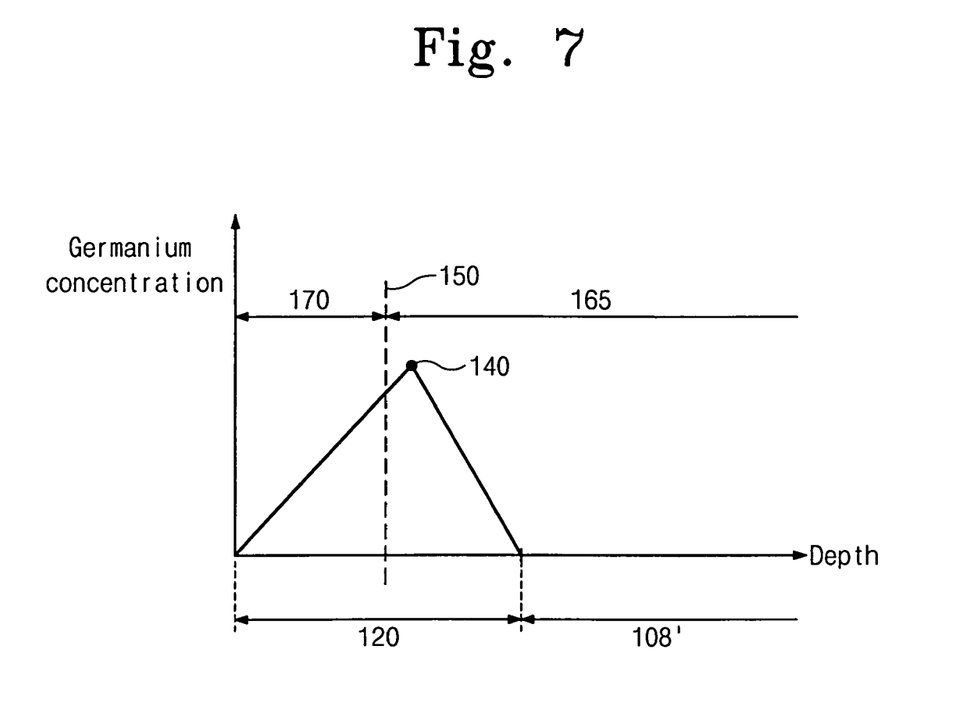
FIG. 7 illustrates a germanium concentration of a silicon germanium epitaxial layer shown in FIG. 5.
Figure 8:
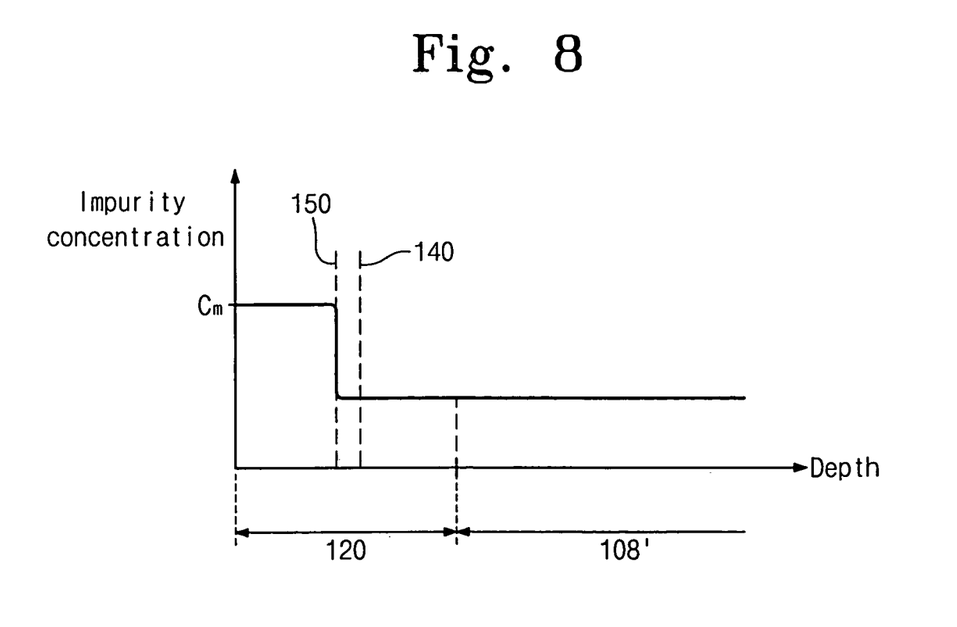
FIG. 8 illustrates an impurity concentration of the silicon germanium epitaxial layer shown in FIG. 5.

FIGS. 7-8 illustrate exemplary germanium and impurity concentrations for the silicon germanium epitaxial layer of FIG. 5, respectively.

Referring also to FIGS. 5, 6A-6B, the x-axes of FIGS. 7-8 represent respective depths from a top surface of the silicon germanium epitaxial layer 120. The y-axis of FIG. 7 represents a germanium concentration, and the y-axis of FIG. 8 represents a concentration of impurities doping the silicon germanium epitaxial layer 120.

The silicon germanium epitaxial layer 120 comprises a maximum germanium-doped region 140. A germanium concentration of the silicon germanium epitaxial layer 120 increases gradually from a bottom surface to the maximum germanium concentration region 140 and thereafter decreases gradually from the maximum germanium concentration region 140 to a top surface.

As described above, a first semiconductor portion including the buried doping layer 102 and the first silicon epitaxial layer 104 and a second semiconductor portion including the body region 108' and the silicon germanium epitaxial layer 120 constitute a PN junction. Thus, a first conductivity-type region, a depletion region 165, and a second conductivity-type region 170 are sequentially formed on the silicon substrate 100. A boundary between the first conductivity-type region and the depletion region 165 and a boundary between the depletion region 165 and the second conductivity-type region 170 are defined as a first boundary and a second boundary 150, respectively.

The maximum germanium-doped region 140 is disposed in the depletion region 165. The maximum germanium-doped region may be disposed near the second boundary 150. Accordingly, the germanium concentration of the silicon germanium epitaxial layer 120 in the second conductivity-type region 170 increases gradually from a top surface thereof to the second boundary 150.

As illustrated in FIG. 8, the silicon germanium epitaxial layer 120 may be segmented into an upper portion and a lower portion. The upper portion of the silicon germanium epitaxial layer 120 has a higher impurity concentration than the lower portion thereof. Particularly, the lower portion of the silicon germanium epitaxial layer 120 has the same impurity concentration as the second body region 108'. The impurity concentration of the silicon germanium epitaxial layer 120 increases rapidly after passing the maximum germanium-doped region 140. The second boundary 150 may be disposed at a portion where an impurity concentration of the silicon germanium epitaxial layer 120 increases rapidly. Thus, the depletion region 165 is also formed at the lower portion of the silicon germanium epitaxial layer 120, so that the maximum germanium-doped region 140 may be disposed in the depletion region 165. The silicon germanium epitaxial layer 120 includes a region in which the maximum impurity concentration Cm is uniformly exhibited.

Referring to FIGS. 5 and 6A-6B, a pad conductive pattern 122a is disposed on the insulation layer 116' adjacent to one side of the silicon germanium epitaxial layer 120. The pad conductive pattern 122a is electrically connected to the silicon germanium epitaxial layer 120. The pad conductive pattern 122a may be formed from polysilicon germanium doped with impurities of second conductivity type.

A lower interlayer dielectric 124 is disposed to cover the resulting structure form on silicon substrate 100. An opening 132 is then formed in the lower interlayer dielectric layer 124 to expose the silicon germanium epitaxial layer 120. A first contact hole 126a is formed through the lower interlayer dielectric 124 and the insulation layer 116' to expose a predetermined region of the peripheral isolation doping layer 110a. A second contact hole 126a is formed through the lower interlayer dielectric 124 to expose the pad conductive pattern 122a. The first contact hole 126a is disposed at one side of the silicon germanium epitaxial layer 120, and the second contact hole 126b is disposed at the other side thereof.

First and second interconnections 128a and 128b are disposed on the lower interlayer dielectric 124. The first interconnection 128A is connected with the peripheral isolation doping layer 110a through the first contact hole 126a, and the second interconnection 128b is connected with the peripheral isolation layer 110b through the second contact hole 126b. The first interconnection 128a is connected with the first conductivity-type region of the photodiode through the peripheral isolation doping layer 110a, the first silicon epitaxial layer 104, and the buried doping layer 102. The second interconnection 128b is electrically connected with the silicon germanium epitaxial layer 120 through the pad conductive pattern 122a. That is, the second interconnection 128b is connected with the second conductivity-type region of the photodiode.

The first contact hole 126A may be filled with the material forming the first interconnection 128a. Alternatively, the first contact hole 126a may be filled with a conductive contact plug and the first interconnection 128a may be connected with the conductive contact plug filling the first contact hole 126a. Similarly, the second contact hole 126b may be filled with the material forming the second interconnection 128b. Alternatively, the second contact hole 126b is filled with a conductive contact plug and the second interconnection 128b may be connected with a conductive contact plug filling the second contact hole 126b.

A heavily-doped contact doping layer 114 is disposed at an upper portion of the peripheral isolation doping layer 110a exposed by the first contact hole 126a. The heavily-doped contact doping layer 114 is doped with impurities of first conductivity type. The impurity concentration of the heavily-doped contact doping layer 114 is higher than that of the peripheral isolation doping layer 110a.

A buffer contact doping layer 106 is disposed over the first silicon epitaxial layer 102 below the peripheral isolation doping layer 110a where the heavily-doped contact doping layer 114 is formed. The buffer contact doping layer 106 is doped with impurities of first conductivity type. An impurity concentration of the buffer contact doping hole 106 is higher than that of the first silicon epitaxial layer 102.

The heavily-doped contact doping layer 114, the peripheral isolation doping layer 110a, and the buffer contact doping layer 106 are all doped with impurities of first conductivity type. Accordingly, the first interconnection 128a is connected with the first conductivity-type region of the photodiode through the doping layers 114, 110a, and 106. The high impurity concentrations of the heavily-doped contact doping layer 114 and the buffer contact doping layer 106 result in reduced resistance between the first interconnection 128a and the first conductivity-type region of the photodiode.

The heavily-doped contact doping layer 114 and the buffer contact doping layers 106 may not be disposed at the central isolation doping layer 110b. That is, the central isolation doping layer 110b may serve only to define the body region 108' while the peripheral isolation doping layer 110a may serve to define the body region 108' as well as to connect the first interconnection 128a with the first conductivity type region. As a result, the heavily-doped contact doping layer 114 and the buffer contact doping layer 106 may be disposed only on the peripheral isolation doping layer 110a.

An upper interlayer dielectric 130 is disposed to cover the resulting structure formed on the silicon substrate 100. Opening 132 may be re-formed upward through the upper interlayer dielectric 130, such that the silicon germanium epitaxial layer 120 is exposed by the opening 132. The upper interlayer dielectric 130 thus covers the first and second interconnections 128a and 128b. The upper and the lower interlayer dielectrics 124 and 130 may be formed from an insulating material such as silicon oxide.

An anti-reflective film 135 is formed on the exposed silicon germanium epitaxial layer 120. The anti-reflective film 135 is made of a material that reduces the reflection of an externally applied optical signal. The anti-reflective film 135 may be made of, for example, silicon oxide, silicon nitride or a combination thereof.

The operation and characteristics of the above-described, exemplary photo-detecting device will now be described with reference to an energy band diagram shown in FIG. 9.

Figure 9:
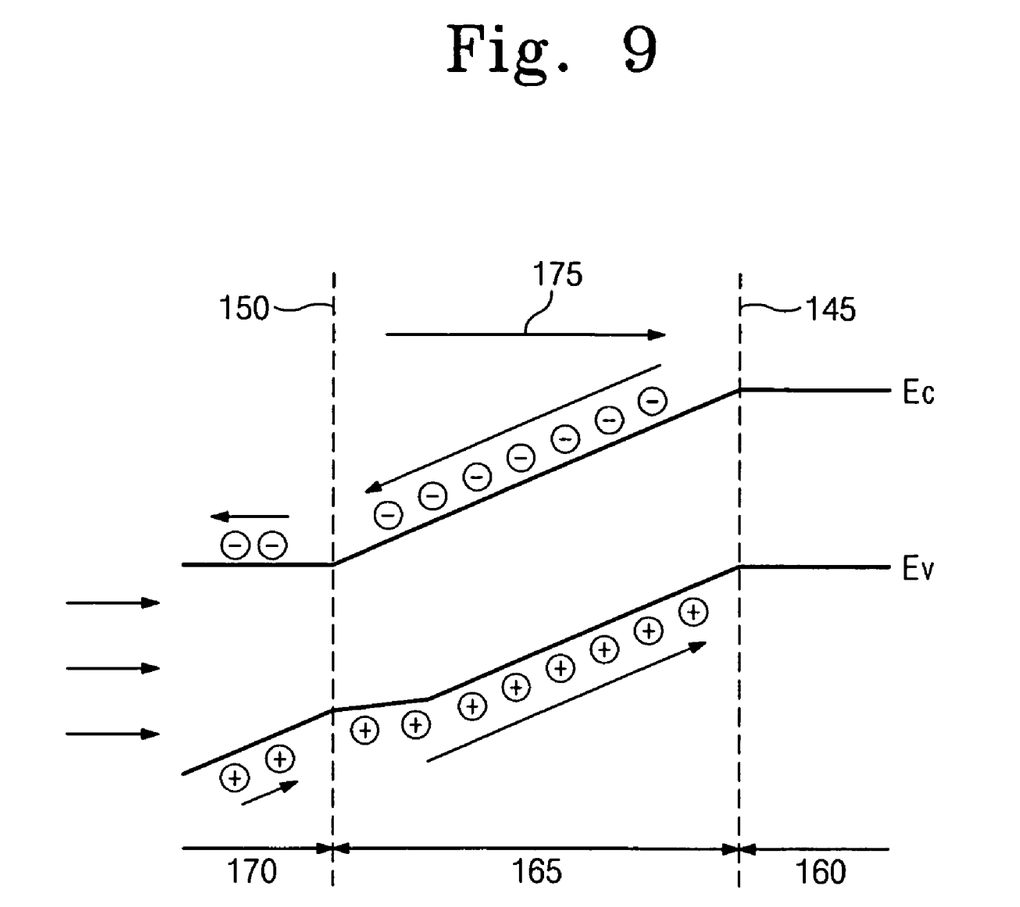
FIG. 9 is an energy band diagram taken along a line V-V' of FIG. 6A.

Referring also to FIGS. 5, 6A-6B, and 7-8, the energy band diagram of FIG. 9 shows a reverse bias applied to the photodiode using the first and second interconnections 128a and 128b. Further, FIG. 9 shows the case where impurities of first conductivity type are P-type impurities and impurities of second conductivity type are N-type impurities.

In FIG. 9, reference numerals "160", "165", and "170" represent a first conductivity-type region 160, a depletion region 165, and a second conductivity-type region 170 of the photodiode constituted by the PN junction, respectively. In addition, reference numerals "145" and "150" represent a first boundary 145 between the first conductivity-type region 160 and the depletion region 165 and a second boundary 150 between the depletion region 165 and the second conductivity-type region 170, respectively.

An energy band gap of germanium (approximately 0.67 eV) is lower that that of silicon (approximately 1.1 eV). Therefore, an energy band gap of SiGe is lower than that of Si and higher than that of Ge. An energy band gap of SiGe decreases with increase in concentration of Ge. To the contrary, the energy band gap of SiGe increases with decrease in concentration of Ge.

In this regard, the silicon germanium epitaxial layer 120 may control a germanium concentration to define its energy band. Since a germanium concentration of the silicon germanium epitaxial layer 120 increases gradually from a top surface thereof to the maximum germanium-doped region 140, a band gap of the second conductivity-type region 170 decreases gradually. Particularly, a valence band of second conductivity-type region 170 is inclined with a positive inclination. Mobility of the holes generated in the second conductivity-type region by the applied optical signal increases due to the inclined valence band Ev of the second conductivity-type region 170. As a result, the holes generated in the second conductivity-type region 170 migrate to the depletion region 165 at relatively high speed. The holes migrating to the depletion region 165 migrate under the influence of an internal electric field 175 of the depletion region 165 at relatively high speed, streaming to the first interconnection 128a.

The maximum germanium-doped region 140 is disposed in the depletion region 165, so that only the valence band Ev having the positive inclination may be included in the second conductivity-type region 170. Accordingly, the holes generated in the second conductivity-type region 170 may migrate to the depletion region 165 at relatively higher speed.

As a result, mobility of the holes generated in the second conductivity-type region 170 increases due to the inclined valence band Ev. In other words, the holes generated in the second conductivity-type region 170 have a much higher mobility than holes generated by a conventional diffusion. Thus, the response characteristics and an operating speed of the photodiode are enhanced. Moreover, a current tail described in the context of the conventional signal currents is reduced to prevent a signal (e.g., output data) distortion phenomenon present in the conventional device.

The silicon germanium epitaxial layer 120 may be segmented into a lower portion and an upper portion. Since an impurity concentration of the lower portion is lower than that of the upper portion, the depletion region 165 extends to the lower portion of the silicon germanium epitaxial layer 120 to readily locate the second boundary 150 in the silicon germanium epitaxial layer 120.

Further, the second interconnection 128B is electrically connected to the silicon germanium epitaxial layer 120 through the pad conductive pattern 122a disposed on the insulation layer 116'. Accordingly, a plane area required for the formation of the silicon germanium epitaxial layer 120 may be smaller than that required in the conventional N-type heavily doped layer. That is, the conventional N-type heavily doped layer requires an area sufficient to also contact the corresponding interconnection. To the contrary, the silicon germanium epitaxial layer 120 does not require an area for contacting the second interconnection 128b. As a result, the plane area of the silicon germanium epitaxial layer 120 is reduced and correspondingly lowers the capacitance of a parasitic junction capacitor of the photodiode. Thus, a photodiode having a much higher operating speed may be fabricated, because if the capacitance of the parasitic junction capacitor increases, the mobility of the charges generated by the applied optical signal may be reduced thereby decreasing the response speed of the photodiode.

FIGS. 10A-14A are cross-sectional views, taken along a line III-III' of FIG. 5, for illustrating one or more methods of forming a photo-detecting device according to one or more embodiments of the invention. FIGS. 10B-14B are cross-sectional views, taken along a line IV-IV' of FIG. 5, further illustrating one or more methods of forming a photo-detecting device according to one or more embodiments of the invention.

Figure 10A:
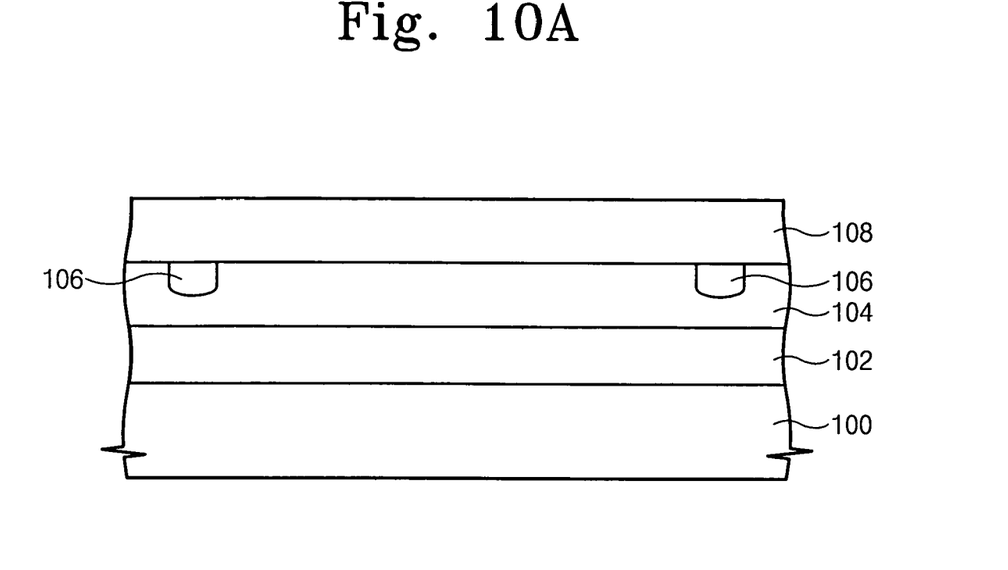
Figure 10B:
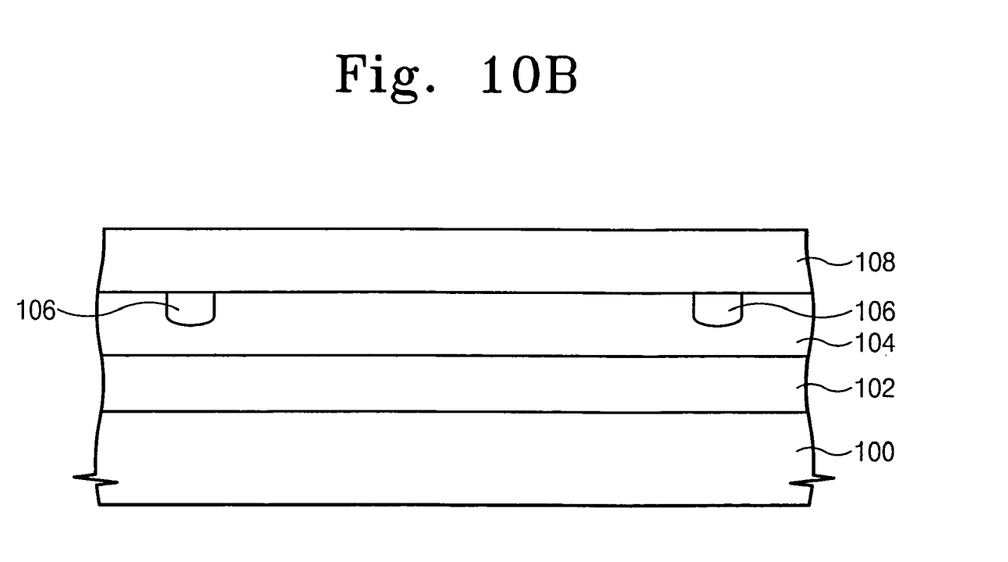

Referring to FIGS. 10A-10B, a buried doping layer 102 doped having impurities of first conductivity type is formed on a silicon substrate 100. The formation of the buried doping layer 102 may be done by implanting impurities of first conductivity type into the upper portion of the silicon substrate 100.

A first silicon epitaxial layer 104 doped with impurities of first conductivity type is formed on the buried doping layer 102. The formation of the first silicon epitaxial layer 104 is done by means of a first epitaxial growth process using a silicon source gas for the silicon substrate 100 including the buried doping layer 102. The first silicon epitaxial layer 104 may be doped in-situ. That is, the formation of the first silicon epitaxial layer 104 may be done by means of the first epitaxial growth process using a first conductivity-type impurity source gas as well as the silicon source gas. An impurity concentration of the buried doping layer 102 is higher than that of the first silicon epitaxial layer 104.

Impurities of the first conductivity type are selectively implanted into a predetermined region of the first silicon epitaxial layer 104 to form a buffer contact doping layer 106. An impurity concentration of the buffer contact doping layer 106 is higher than that of the first silicon epitaxial layer 104.

A second silicon epitaxial layer 108 doped with impurities of a second conductivity type is formed on the silicon substrate 100 including the buffer contact doping layer 106. The formation of the second silicon epitaxial layer 108 is done by means of a second epitaxial growth process using a silicon source gas. The second silicon epitaxial layer 108 may be doped in-situ. That is, the formation of the second silicon epitaxial layer 108 may be done by means of the second epitaxial growth process using a second conductivity-type impurity source gas as well as the silicon source gas.

The impurities of the first conductivity type and the impurities of the second conductivity type may be P-type impurities and N-type impurities and vice versa, respectively. The first and the second silicon epitaxial layers 104 and 108 are doped with impurities of different conductivity types, so that the combination of first and the second silicon epitaxial layers 104 and 108 constitute a PN junction.

Figure 11A:
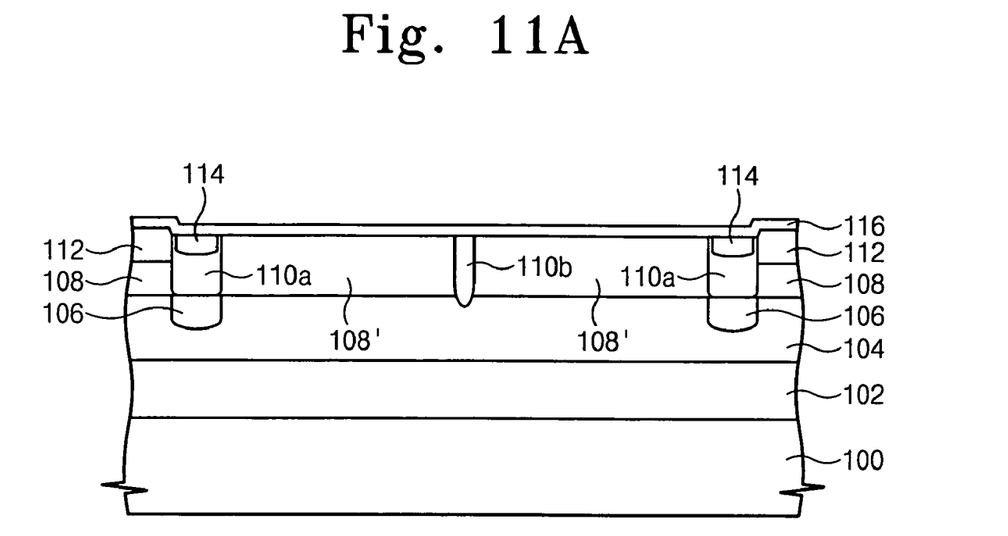
Figure 11B:
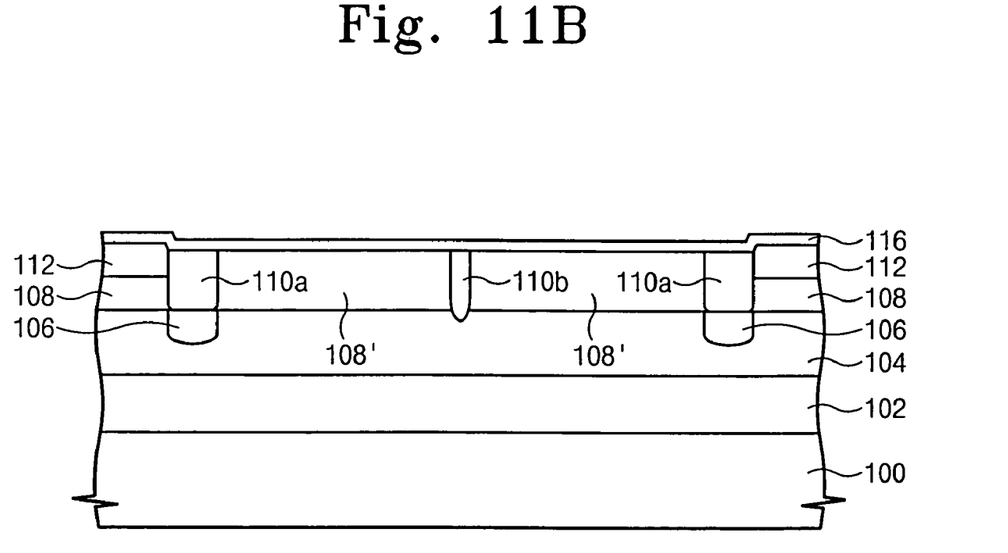

Referring to FIGS. 11A-11B, by selectively implanting impurities of first conductivity type into the second silicon epitaxial layer 108, isolation doping layers 110a and 110b are formed to define body regions 108' within the second silicon epitaxial layer 108. Each body region 108' may be form as a portion of the second silicon epitaxial layer 108. The isolation doping layers 110a and 110b may be divided into a peripheral isolation doping layer 110a and a central isolation doping layer 110b. The peripheral isolation doping layer 110a encompasses the body regions 108', and the central isolation doping layer 110b is disposed between respective body regions 108'.

The isolation doping layers 110a and 110b extend downward to electrically contact the first silicon epitaxial layer 104. In particular, the peripheral isolation doping layer 110a is formed on the buffer contact doping layer 106 so as to be electrically interconnected. The buffer contact doping layer 106 may not be formed below the central isolation doping layer 110b.

Device isolation layers 112 are formed at predetermined regions of the second silicon epitaxial layer 108 to define active regions. The body regions 108' and the isolation doping layer 110a and 110b are formed at the active regions.

Impurities of first conductivity type are selectively implanted into a predetermined region of the peripheral isolation doping layer 110a to form a heavily-doped contact doping layer 114. An impurity concentration of the heavily-doped contact doping layer 114 is higher than that of the peripheral isolation doping layer 110a.

Following the formation of the isolation doping layers 110a and 110b and the heavily-doped contact doping layer 114, an upper device isolation layer 112 may be formed. Alternatively, following the formation of the device isolation layer 112, the isolation doping layer 110a and 110b and the heavily-doped contact doping layer 114 may be formed.

Figure 12A:
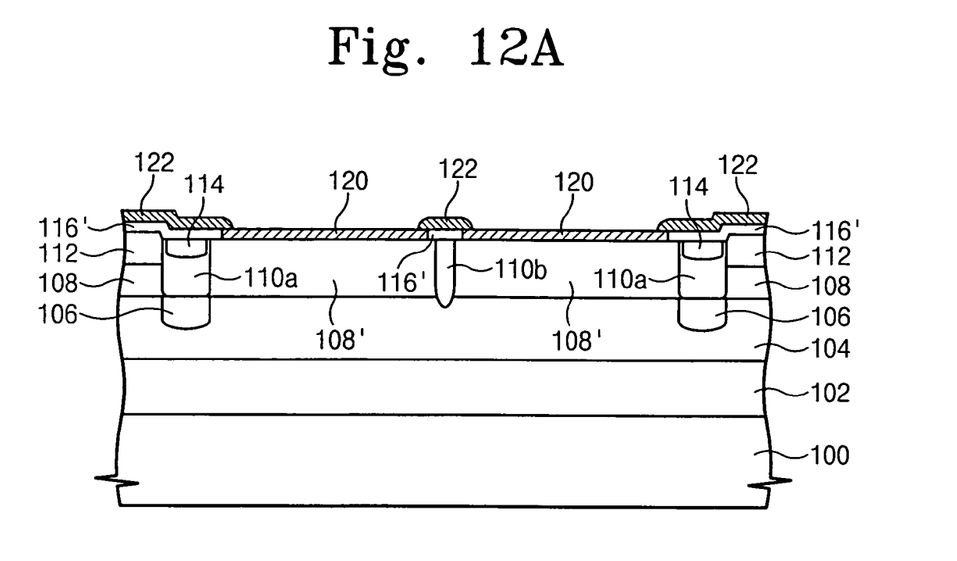
Figure 12B:
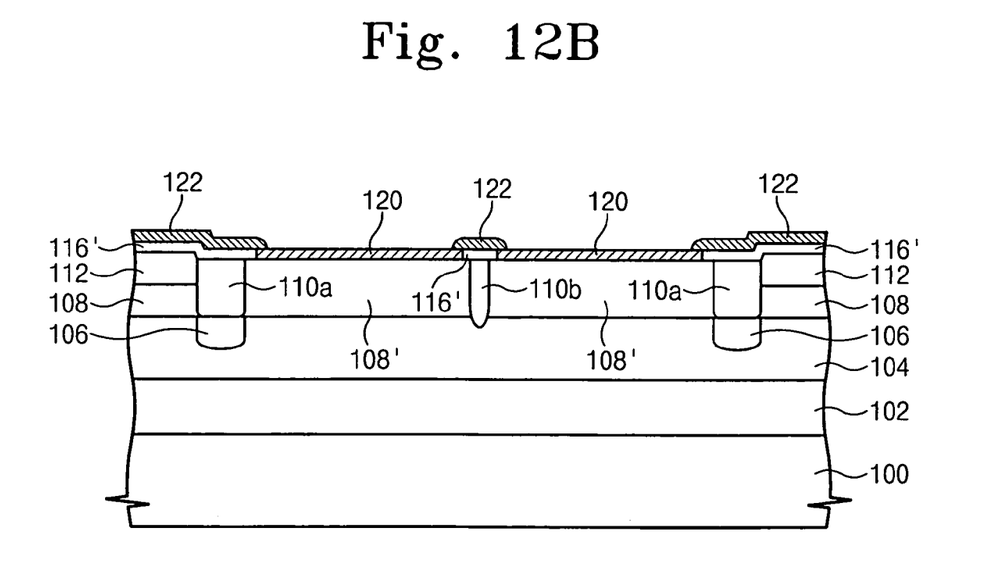

Referring to FIGS. 12A-12B, an insulation layer 116 is patterned to expose a top surface of the body region 108'. The patterned insulation layer 116' covers the isolation doping layer 110a and 110b and a heavily-doped contact doping layer 114. Undoubtedly, the patterned doping layer 116' may cover the device isolation layer 112.

A silicon germanium epitaxial layer 120 is formed on the exposed body region 108' by means of a third epitaxial growth process using a process gas containing silicon and germanium source gases for the silicon substrate 100 including the exposed body region 108'. A polysilicon germanium layer 122 is formed on the patterned insulation layer 116' to contact the silicon germanium epitaxial layer 120. In other words, by means of the third epitaxial growth process, the silicon germanium epitaxial layer 120 of a single-crystalline state is formed on the exposed body region 108' made of single-crystalline silicon and the silicon germanium layer 122 of a polycrystalline state is formed on the patterned insulation layer 116'.

The silicon germanium epitaxial layer 120 and the polysilicon germanium layer 122 are doped with impurities of second conductivity type. Thus, the silicon germanium epitaxial layer 120 and the polysilicon germanium layer 122 are electrically connected with each other.

The silicon germanium epitaxial layer 120 is formed to include a maximum germanium-doped region. (See, for example, region 140 in FIG. 7). The germanium concentration of the silicon germanium epitaxial layer 120 increases gradually from a bottom surface to the maximum germanium-doped region and decreases gradually from the maximum germanium-doped region to a top surface. As described above, the maximum germanium-doped region is formed in a depletion region. During the third epitaxial growth process, the amount of the germanium source gas increases gradually and, from the peak, decreases gradually such that the silicon germanium epitaxial layer 120 is formed to have the foregoing germanium concentration.

The silicon germanium epitaxial layer 120 is segmented into an upper portion and a lower portion. The upper portion of the silicon germanium epitaxial layer 120 has a higher impurity concentration than the lower portion thereof. The lower portion of the silicon germanium epitaxial layer 120 has the same impurity concentration as the body region 108'. Moreover, an impurity concentration of the silicon germanium epitaxial layer 120 increases rapidly after passing the maximum germanium-doped region. (See, for example, region 140 in FIG. 7). The upper portion of the silicon germanium epitaxial layer 120 includes a region maintained at a constant maximum impurity concentration. (See, for example, concentration Cm in FIG. 7).

The silicon germanium epitaxial layer 120 and the polysilicon germanium layer 122 may be doped in-situ. Specifically, a process gas used during the third epitaxial growth process further contains a second conductivity-type impurity source gas. The third epitaxial growth process uses an amount of the second conductivity-type impurity source gas, which is sufficient to realize the impurity concentration of the body region in the early stage of the process. In the third epitaxial growth process, the amount of the second conductivity-type impurity source gas injected increases rapidly after injecting the maximum amount of the germanium source gas. As a result, the silicon germanium epitaxial layer 120 having the foregoing, exemplary impurity concentration may be formed. (See, for example, FIG. 8).

Figure 13A:
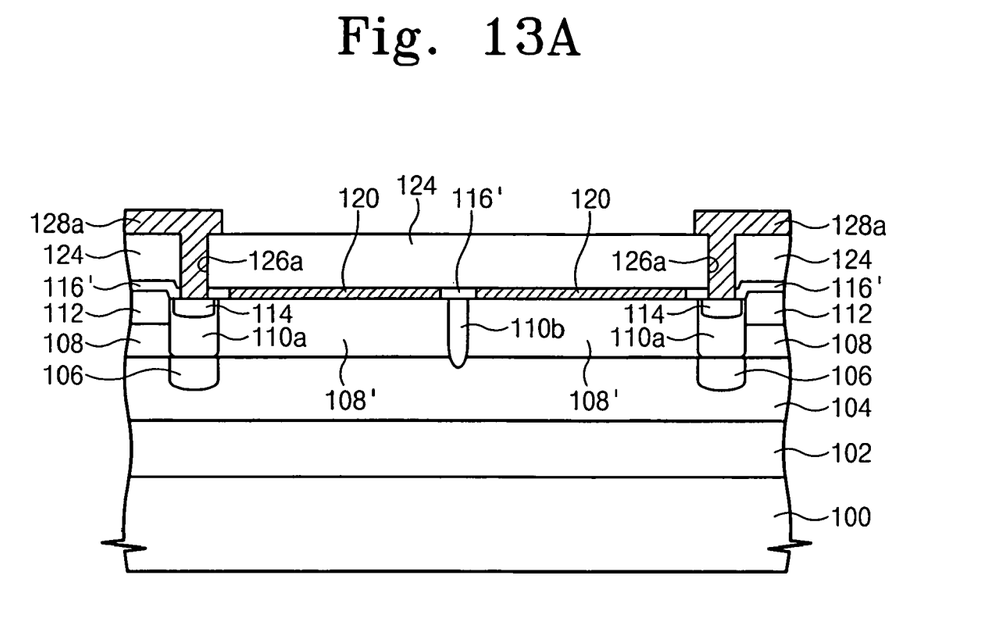
Figure 13B:
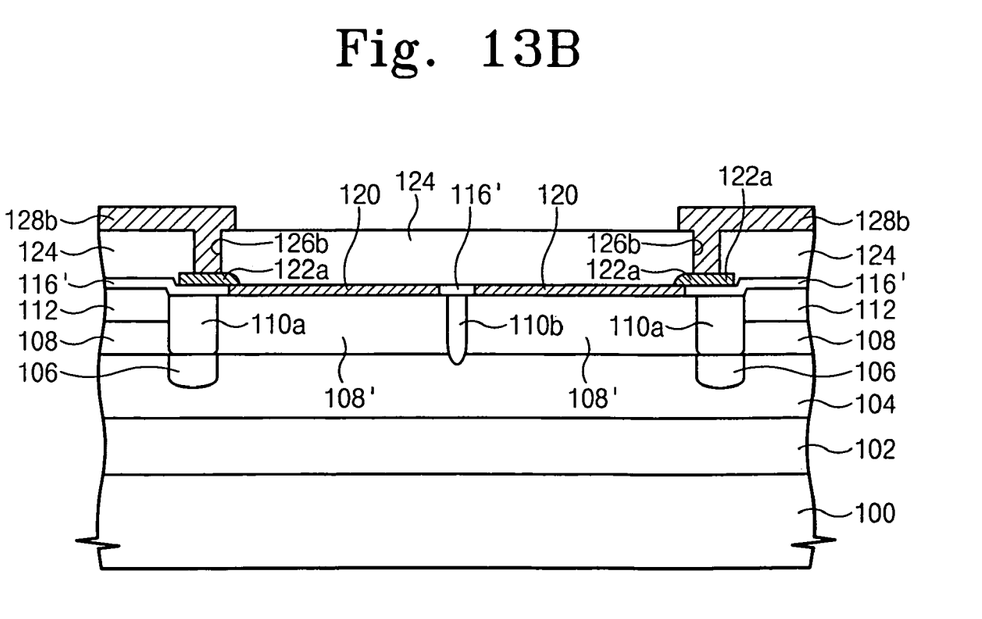

Referring to FIGS. 13A-13B, the polysilicon germanium layer 122 is patterned to form a pad conductive pattern 122a at one side of the silicon germanium epitaxial layer 120. The pad conductive pattern 122a is electrically connected with the silicon germanium epitaxial layer 120.

A lower interlayer dielectric 124 is formed on the silicon substrate 100 including the pad conductive pattern 122a. The lower interlayer dielectric 124 may be formed from an insulating material such as silicon oxide. A first contact hole 126a is formed through the lower interlayer dielectric 124 and the patterned insulation layer 116' to expose the heavily-doped contact doping layer 114. A second contact hole 126b is formed through the lower interlayer dielectric 124 to expose the pad conductive pattern 122a. The first and second contact holes 126a and 126b are formed simultaneously. Alternatively, they may be formed sequentially.

A first interconnection 128a and a second interconnection 128b are formed on the lower interlayer dielectric 124. The first interconnection 128a is connected with the heavily-doped contact doping layer 114 through the first contact hole 126a, and the second interconnection 128b is connected with the pad conductive pattern 122a through the second contact hole 126b. The first and second interconnections 128a and 128b are formed simultaneously.

After forming the first and second contact holes 126a and 126b, an interconnection conductive layer may be formed on the lower interlayer dielectric 124 to fill the contact holes. The interconnection conductive layer may be patterned to form the first and second interconnections 128a and 128b. Alternatively, after forming an interconnection conductive layer on an entire surface of the silicon substrate 100 to fill the contact holes 126a and 126b, the interconnection conductive layer may be patterned to form the first and second interconnections 128a and 128b.

Figure 14A:
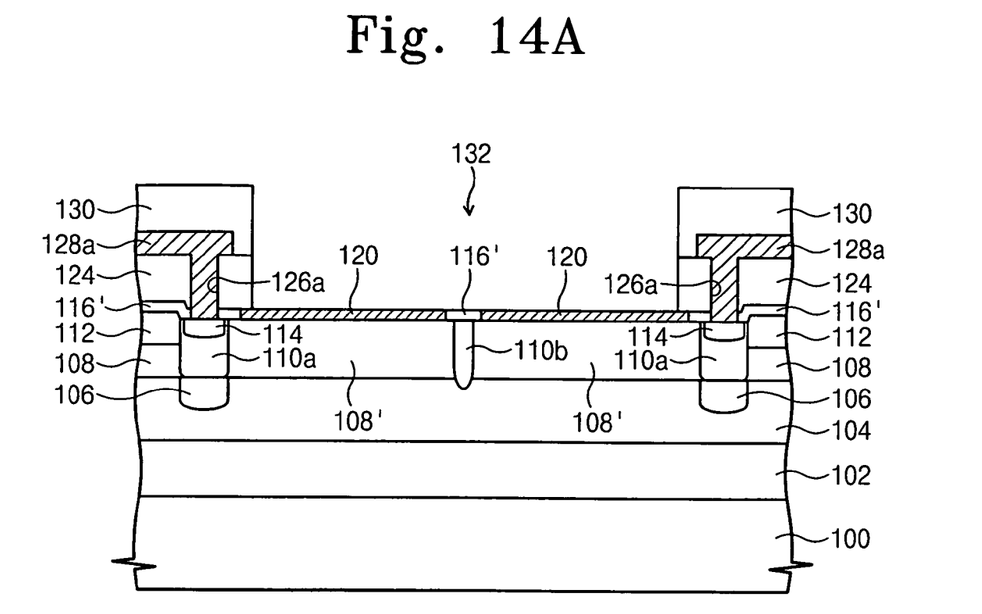
Figure 14B:
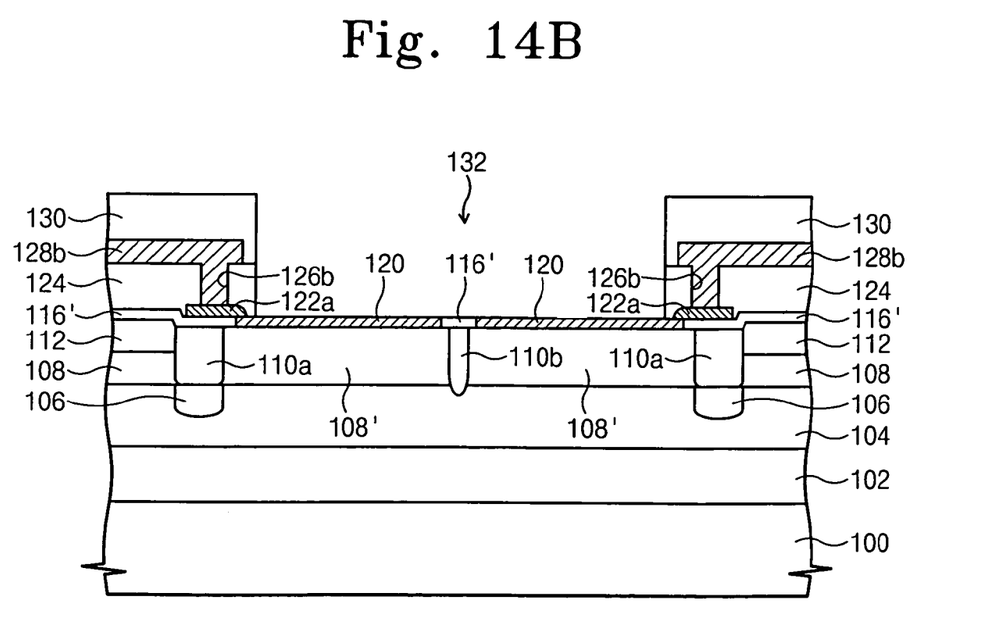

Referring to FIGS. 14A-14B, an upper interlayer dielectric 130 is formed to cover the resulting structure formed on the silicon substrate 100, and thereafter patterned. The upper interlayer dielectric 130 may be made of silicon oxide. The upper interlayer dielectric 130 covers the interconnections 128a and 128b as well as the lower interlayer dielectric 124.

The upper and the lower interlayer dielectrics 130 and 124 are successively patterned to form an opening 132 exposing the silicon germanium epitaxial layer 120.

An anti-reflective film 135 shown in FIGS. 6A-6B is conformally formed on the resulting surface formed on the silicon substrate 100 to fabricate the exemplary photo-detecting device shown in FIGS. 6A-6B. The anti-reflective film 135 may be made of silicon oxide, silicon nitride or a combination thereof.

According to embodiments of the invention, a photo-detecting device includes a silicon germanium epitaxial layer formed on a photodiode to define a corresponding energy band. The energy band of the applied optical signal portion (i.e., the portion corresponding to a conventional neutral region) of the photodiode is inclined to significantly increase the mobility of holes generated at the applied optical signal portion. Therefore, it is possible to enhance the response characteristics of the photo-detecting device to the applied optical signal such that a higher operating speed is achieved. Further, the tail current so prevalent in the conventional device is reduced, thereby suppressing noise in the output signal of the photodiode.

In one embodiment of the invention, an interconnection is electrically connected to the silicon germanium epitaxial layer through a pad conductive pattern on an insulation layer disposed at one side of the silicon germanium epitaxial layer. Thus, the silicon germanium epitaxial layer has a smaller plane area than a layer doped with N-type impurities, which leads to a decrease in a plane area of the photodiode. As a result, the capacitance of a parasitic junction capacitor is reduced to further enhance an operating speed of the photodiode.

While the present invention has been described in some detail with reference to certain embodiments, many modifications, variations and extensions of these embodiments are possible. The scope of invention encompasses these modifications, variations and extensions and is defined by the appended claims.

What is claimed is:

1. A photo-detecting device comprising:
    a buried doping layer of first conductivity type disposed on a silicon substrate;
    a first silicon epitaxial layer of first conductivity type disposed on the buried doping layer;
    a second silicon epitaxial layer of second conductivity type disposed on the first silicon epitaxial layer;
    an isolation doping layer of first conductivity type disposed at predetermined regions of the second silicon epitaxial layer to define a body region formed from a portion of the second silicon epitaxial layer; and,
    a silicon germanium epitaxial layer of second conductivity type disposed on the body region.

2. The device of claim 1, wherein the silicon germanium epitaxial layer comprises a germanium concentration profile increasing from a bottom surface to the silicon germanium epitaxial layer to a maximum germanium concentration region, and then decreasing from the maximum germanium concentration to a top surface of the silicon germanium epitaxial layer.

3. The device of claim 2, wherein a combination of the buried doping layer and the first silicon epitaxial layer with a combination of the body region and the silicon germanium epitaxial layer form a PN junction having a depletion region, and wherein the maximum germanium concentration region is disposed within the depletion region.

4. The device of claim 1, wherein the silicon germanium epitaxial layer comprises an upper portion extending downward from a top surface and a lower portion extending upwards from a bottom surface; and,
   wherein the upper portion has a higher impurity concentration than the lower portion.

5. The device of claim 4, wherein the silicon germanium epitaxial layer comprises a germanium concentration profile increasing from the bottom surface to the silicon germanium epitaxial layer through the lower portion and into the upper portion to a maximum germanium concentration region, and then decreasing from the maximum germanium concentration to the top surface.

6. The device of claim 5, wherein a combination of the buried doping layer and the first silicon epitaxial layer with a combination of the body region and the silicon germanium epitaxial layer form a PN junction having a depletion region;
   wherein the maximum germanium concentration region is disposed within the depletion region; and
   wherein a lower portion of the silicon germanium epitaxial layer comprises an impurity concentration equal to the impurity concentration of the body region.

7. The device of claim 1, further comprising:
   an insulation layer disposed on the second silicon epitaxial layer and isolation doping layer and exposing the silicon germanium epitaxial layer; and
   a pad conductive pattern disposed on the insulation layer at one side of the silicon germanium epitaxial layer and electrically connected to the silicon germanium epitaxial layer.

8. The device of claim 7, wherein the pad conductive pattern is formed from polysilicon germanium doped with impurities of second conductivity type.

9. The device of claim 7, further comprising:
   an interlayer dielectric disposed on the second silicon epitaxial layer and having an opening exposing the silicon germanium epitaxial layer;
   a first interconnection disposed on the interlayer dielectric and connected with the isolation doping layer through a first contact hole formed in the interlayer dielectric and the insulation layer; and
   a second interconnection disposed on the interlayer dielectric and connected with the pad conductive pattern through a second contact hole formed in the interlayer dielectric, and
   wherein the isolation doping layer extends downward to connect with the first silicon epitaxial layer.

10. The device of claim 9, further comprising:
    a heavily-doped contact doping layer disposed at a portion of the isolation doping layer connected with the first interconnection and doped with impurities of first conductivity type, the heavily-doped contact doping layer having a higher impurity concentration than the isolation doping layer; and
    a buffer contact doping layer disposed at the first silicon epitaxial layer below the isolation doping layer connected with the first interconnection and doped with impurities of first conductivity type, the buffer contact doping layer having a higher impurity concentration than that the first silicon epitaxial layer,
    wherein the first interconnection is connected with the first silicon epitaxial layer and the buried doping layer through the heavily-doped contact doping layer, the isolation doping layer, and the buffer contact doping layer.

11. The device of claim 9, further comprising:
    an anti-reflective film disposed on the exposed silicon germanium epitaxial layer.

12. A method for forming a photo-detecting device, comprising:
    forming a buried doping layer doped of first conductivity type on a silicon substrate;
    forming a first silicon epitaxial layer of first conductivity type on the buried doping layer;
    forming a second silicon epitaxial layer of second conductivity type on the first silicon epitaxial layer;
    forming an isolation doping layer of first conductivity type at a predetermined region of the second silicon epitaxial layer to define a body region from a portion of the second silicon epitaxial layer; and
    forming a silicon germanium epitaxial layer of the second conductivity type on the body region.

13. The method of claim 12, wherein the silicon germanium epitaxial layer comprises a germanium concentration profile increasing from a bottom surface to the silicon germanium epitaxial layer to a maximum germanium concentration region, and then decreasing from the maximum germanium concentration to a top surface of the silicon germanium epitaxial layer.

14. The method of claim 13, wherein a combination of the buried doping layer and the first silicon epitaxial layer with a combination of the body region and the silicon germanium epitaxial layer form a PN junction having a depletion region; and
    wherein the maximum germanium concentration region is formed within the depletion region.

15. The method of claim 14, wherein the forming the silicon germanium epitaxial layer comprises:
    performing an epitaxial growth process using a process gas containing silicon and germanium source gases, wherein the amount of the germanium source gas supplied to the process gas gradually increases, peaks, and then gradually decreases.

16. The method of claim 12, wherein the silicon germanium epitaxial layer comprises an upper portion extending downward from a top surface and a lower portion extending upward from a bottom surface, wherein the upper portion has a higher impurity concentration than the lower portion.

17. The method of claim 16, wherein the silicon germanium epitaxial layer comprises a germanium concentration profile increasing from the bottom surface to the silicon germanium epitaxial layer through the lower portion and into the upper portion to a maximum germanium concentration region, and then decreasing from the maximum germanium concentration to the top surface.

18. The method of claim 17, wherein a combination of the buried doping layer and the first silicon epitaxial layer with a combination of the body region and the silicon germanium epitaxial layer form a PN junction having a depletion region;
    wherein the maximum germanium concentration region is disposed in the depletion region; and
    wherein a lower portion of the silicon germanium epitaxial layer comprises an impurity concentration substantially equal to the impurity concentration of the body region, wherein the impurity concentration of the silicon germanium epitaxial layer increases rapidly from the lower portion to the maximum germanium concentration region.

19. The method of claim 17, wherein the forming the silicon germanium epitaxial layer comprises:
performing an epitaxial growth process using a process gas containing silicon and germanium source gases and a source gas containing at least one second conductivity-type impurity;
wherein the amount of the germanium source gas supplied to the process gas gradually increases, peaks, and gradually decreases;
wherein the amount of source gas containing the at least one second conductivity-type impurity is sufficient to realize an impurity concentration with the body region during an early stage of the epitaxial growth process; and
wherein the amount of source gas containing the at least one second conductivity-type impurity increases rapidly after the amount of the germanium source gas peaks.

20. The method of claim 12, further comprising:
forming an insulation layer on the silicon substrate;
patterning the insulation layer to expose a predetermined portion of the body region; and
forming a pad conductive pattern on the insulation layer disposed at one side of the silicon germanium epitaxial layer, the pad conductive pattern being electrically connected to the silicon germanium epitaxial layer; and
wherein the patterned insulation layer covers the isolation doping layer, and the silicon germanium epitaxial layer is formed on the exposed body region.

21. The method of claim 20, wherein the forming the pad conductive pattern comprises:
forming a polysilicon germanium layer on the insulation layer, the polysilicon germanium layer being connected with the silicon germanium epitaxial layer and doped with impurities of second conductivity type; and
patterning the polysilicon germanium layer to form the pad conductive pattern,
wherein the silicon germanium epitaxial layer and the polysilicon germanium layer are formed at the same time.

22. The method of claim 20, further comprising:
forming an interlayer dielectric on the silicon substrate;
forming first and second contact holes, the first contact hole being formed through the interlayer dielectric and the patterned insulation layer to expose the isolation doping layer, and the second contact hole being formed through the interlayer dielectric to expose the pad conductive pattern; and
forming a first interconnection and a second interconnection, the first interconnection being connected with the isolation doping layer through the first contact hole and the second interconnection being connected with the pad conductive pattern through the second contact hole.

23. The method of claim 22, further comprising:
forming a buffer contact doping layer of first conductivity type having a higher impurity concentration than the first silicon epitaxial layer at a predetermined region of the first silicon epitaxial layer; and
forming a heavily-doped contact doping layer at a portion of the isolation doping layer to which the first interconnection is connected, the heavily-doped contact doping layer being doped with impurities of the first conductivity type and having a higher impurity concentration than the isolation doping layer,
wherein the first interconnection is connected with the first silicon epitaxial layer and the buried doping layer through heavily-doped contact doping layer, the isolation doping layer, and the buffer contact doping layer.

24. The method of claim 22, further comprising:
patterning the interlayer dielectric to expose the silicon germanium epitaxial layer; and
forming an anti-reflective film on the exposed silicon germanium epitaxial layer.

* * * * *